United States Patent
Song (10) Patent No.: US 7,755,449 B2
(45) Date of Patent: Jul. 13, 2010

(54) PRINTED CIRCUIT BOARD HAVING IMPEDANCE-MATCHED STRIP TRANSMISSION LINE

(75) Inventor: Ki-Jae Song, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 187 days.

(21) Appl. No.: 12/217,315

(22) Filed: Jul. 3, 2008

(65) Prior Publication Data

US 2009/0009261 A1    Jan. 8, 2009

(30) Foreign Application Priority Data

Jul. 5, 2007    (KR) .................... 10-2007-0067749

(51) Int. Cl.
*H01P 3/08* (2006.01)
*H03H 7/38* (2006.01)

(52) U.S. Cl. .................... 333/33; 333/124; 333/238

(58) Field of Classification Search .................... 333/1, 333/4, 5, 33, 100, 124, 125, 126, 128, 236, 333/238, 245, 246
See application file for complete search history.

(56) References Cited

U.S. PATENT DOCUMENTS

| | | | |
|---|---|---|---|
| 5,682,124 A * | 10/1997 | Suski | 333/1 |
| 6,614,325 B1 * | 9/2003 | Kocin | 333/12 |
| 2002/0084876 A1 * | 7/2002 | Wright et al. | 333/238 |
| 2005/0083147 A1 * | 4/2005 | Barr | 333/33 |

FOREIGN PATENT DOCUMENTS

| | | |
|---|---|---|
| JP | 06302961 | 10/1994 |
| JP | 2001-144451 | 5/2001 |
| KR | 10-0541078 | 1/2006 |

\* cited by examiner

*Primary Examiner*—Stephen E Jones
(74) *Attorney, Agent, or Firm*—Mills & Onello, LLP

(57) ABSTRACT

A printed circuit board (PCB) including an impedance-matched strip transmission line includes a strip transmission line including a main line and at least one pair of branch lines branching off from the main line. An upper ground layer is disposed over the strip transmission line and has upper opening parts corresponding in position to the branch lines. A lower ground layer is disposed under the strip transmission line and has lower opening parts corresponding in position to the branch lines. The upper and lower opening parts are symmetric about the branch lines of the strip transmission line.

20 Claims, 6 Drawing Sheets

PRINTED CIRCUIT BOARD HAVING IMPEDANCE-MATCHED STRIP TRANSMISSION LINE

CROSS-REFERENCE TO RELATED PATENT APPLICATION

This application claims the benefit of Korean Patent Application No. 10-2007-0067749, filed on Jul. 5, 2007, in the Korean Intellectual Property Office, the contents of which are incorporated herein in their entirety by reference.

BACKGROUND OF THE INVENTION

1. Field of the Invention

The present invention relates to a printed circuit board (PCB), and more particularly, to a PCB having an impedance-matched strip transmission line.

2. Description of the Related Art

High-speed memory devices are used in many applications. A package test is used for the assessment of the high-speed memory devices. In the package test, a plurality of memory devices are simultaneously tested in order to reduce manufacturing costs. To this end, a divider formed by using branch patterns of a strip transmission line on a test board is used. In the case of low-speed memory devices, desired data can be input or output by using the divider. However, in the case of the high-speed memory devices, since a reflection wave is generated due to an impedance mismatch in the strip transmission line and a signal delay is caused due to the reflection wave, desired data cannot be accurately input or output by using the divider.

Figure 1:
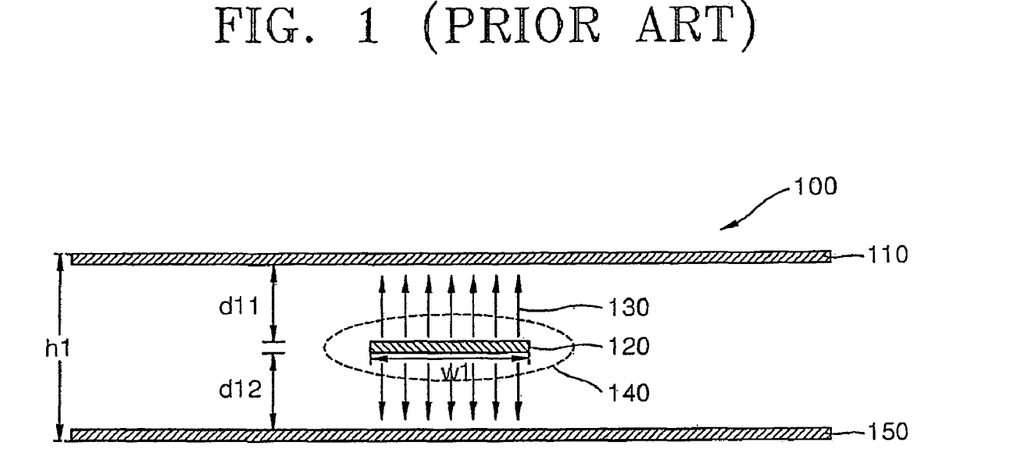
FIG. 1 is a cross-sectional view illustrating a method of controlling an impedance of a strip transmission line of a conventional printed circuit board (PCB).

FIG. 1 is a cross-sectional view illustrating a method of controlling impedance matching of a strip transmission line 120 in a conventional printed circuit board (PCB) 100. Referring to FIG. 1, an upper ground layer 110 is disposed above the strip transmission line 120, and a lower ground layer 150 is disposed below the strip transmission line 120. The strip transmission line 120 has a line width w1, and the PCB 100 has a thickness h1. In FIG. 1, 'd11' denotes a distance between a top surface of the strip transmission line 120 and a bottom surface of the upper ground layer 110, and 'd12' denotes a distance between a bottom surface of the strip transmission line 120 and a top surface of the lower ground layer 150. An electric field 130 is generated between the strip transmission line 120 and the upper and lower ground layers 110 and 150, and a magnetic field 140 is generated around the strip transmission line 120.

An impedance Zo of the strip transmission line 120 is determined by the thickness h1 of the PCB 100, a dielectric constant of a dielectric layer (not shown) surrounding the strip transmission line 120, and the line width w1 of the strip transmission line 120. The impedance Zo of the strip transmission line 120 increases as the thickness h1 of the PCB 100 increases. However, since a total thickness of a multi-layer PCB assembly increases as the thickness h1 of the PCB 100 increases, manufacturing processes are complicated and signal characteristics are degraded. The impedance Zo of the strip transmission line 120 increases as the dielectric constant of the dielectric layer decreases. However, since the dielectric constant of the dielectric layer is dependent on a material of which it is formed, there is a limitation in controlling the impedance Zo of the strip transmission line 120 by using the dielectric constant of the dielectric layer.

Since there is a limitation in controlling the impedance Zo of the strip transmission line 120 by using the dielectric constant of the dielectric layer and the thickness h1 of the PCB 100, a method of controlling the impedance Zo of the strip transmission line 120 by using the line width w1 of the strip transmission line 120 is often used. The impedance Zo of the strip transmission line 120 is expressed by $$Zo = \sqrt{L/C} \qquad (1).$$

The impedance Zo of the strip transmission line 120 is determined by a capacitance C and an inductance L. The impedance Zo increases as the capacitance C decreases, and increases as the inductance L increases. The capacitance C is determined by the distances d11 and d12 between the strip transmission line 120 and the upper and lower ground layers 110 and 150. The inductance L is determined by the line width w1 of the strip transmission line 120. That is, the capacitance C is determined by the electric field 130 whereas the inductance L is determined by the magnetic field 140. Accordingly, as the distances d11 and d12 between the strip transmission line 120 and the upper and lower ground layers 110 and 150 increase, the capacitance C increases, thereby decreasing the impedance Zo. As the line width w1 of the strip transmission line 120 decreases, the inductance L increases, thereby increasing the impedance Zo.

However, there is a limitation in increasing the impedance Zo by reducing the line width w1 of the strip transmission line 120. In particular, in order to increase the impedance Zo, branch transmission lines are realized as fine patterns with a reduced line width, thereby making it difficult to match impedances between the branch transmission lines.

Also, as the number of package balls or pins increases, the number of unit PCBs stacked on the multi-layer PCB assembly increases. As the number of the unit PCBs increases, the total thickness of the multi-layer PCB assembly increases. In order to reduce the total thickness of the multi-layer PCB assembly, the thickness of each of the unit PCBs should be minimized. As the thickness of each of the unit PCBs decreases, the distances d11 and d12 between the strip transmission line 120 and the upper and lower ground layers 110 and 150 decrease, thereby increasing the capacitance C and decreasing the impedance Zo.

Figure 2A:
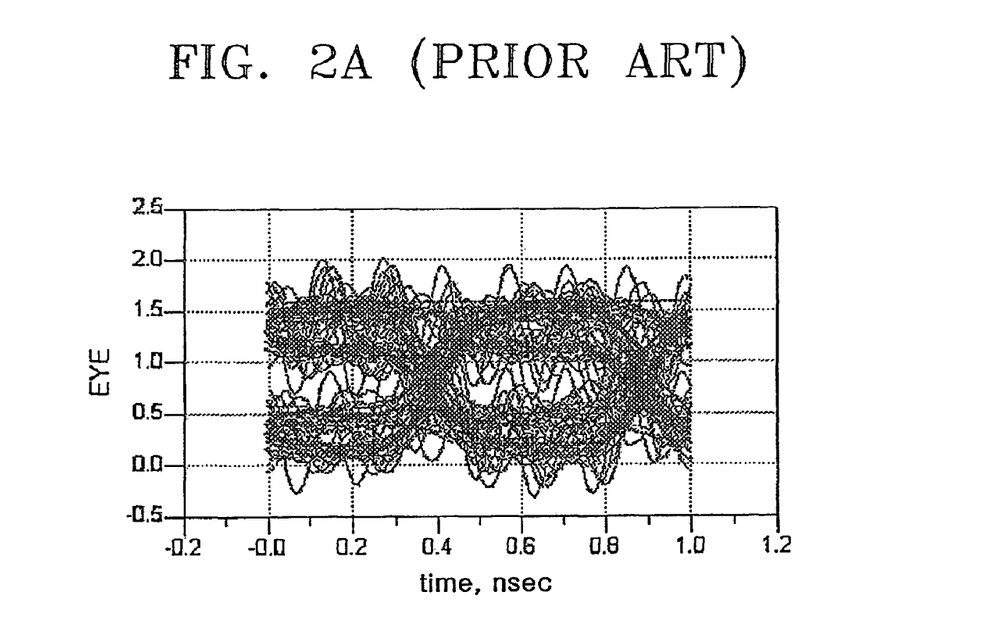
FIGS. 2A and 2B are graphs illustrating simulation results of impedance characteristics of a conventional PCB.
Figure 2B:
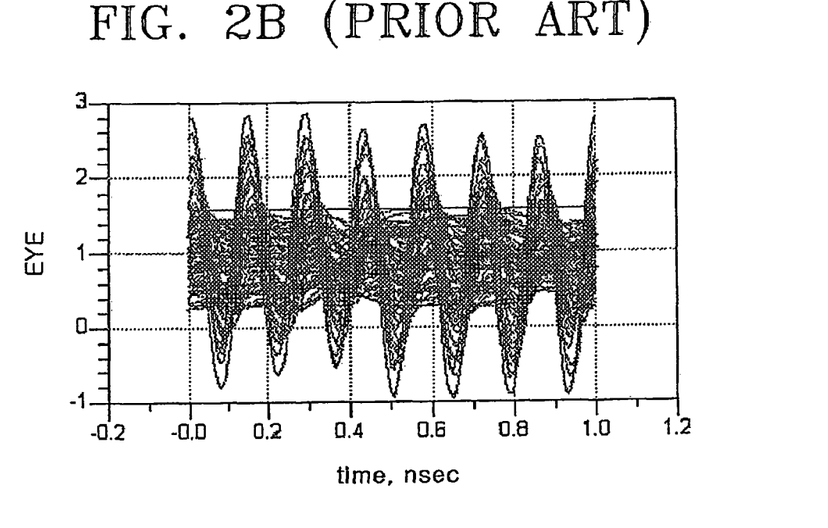

FIG. 2A is a graph illustrating simulation results of a strip transmission line including two branch lines. FIG. 2B is a graph illustrating simulation results of a strip transmission line including four branch lines. Referring to FIGS. 2A and 2B, a reflection wave is generated in the strip transmission line due to an impedance mismatch in the branch lines and a transmission signal is delayed due to the reflection wave, thereby degrading the eye diagram characteristics of the transmission signal. In particular, it can be seen from FIGS. 2A and 2B that as the number of branch lines increases, the eye diagram characteristics are further degraded.

SUMMARY OF THE INVENTION

The present invention provides a printed circuit board (PCB) having an impedance-matched branch strip transmission line.

According to one aspect, the present invention is directed to a PCB. The PCB comprises: a strip transmission line including a main line and at least one pair of branch lines branching off from the main line; an upper ground layer disposed over the strip transmission line and having upper opening parts corresponding in position to the branch lines; and a lower ground layer disposed under the strip transmission line and having lower opening parts corresponding in position to the branch lines. The upper and lower opening parts are symmetric about the branch lines of the strip transmission line.

In one embodiment, the main line and the branch lines have the same line width.

The strip transmission line may include two branch lines. The upper opening parts and the lower opening parts may have the same width. The width of the upper and lower opening parts may be greater than the line width of the strip transmission line. The two branch lines may have an impedance that is controlled by width of the upper and lower opening parts. The two branch lines may have impedance that is twice as high as an impedance of the main line.

The strip transmission line may include at least one pair of (two) branch lines and at least two pairs of (four) branch lines. The upper opening parts of the upper ground layer may comprise: first opening parts having a first width and corresponding in position to the two branch lines; and second opening parts having a second width and corresponding in position to the four branch lines. In one embodiment, each of the first width and the second width is greater than the line width, and the second width is greater than the first width. The lower opening parts of the lower ground layer may comprise: third opening parts having a third width and corresponding in position to the two branch lines; and fourth opening parts having a fourth width and corresponding in position to the four branch lines. In one embodiment, each of the third width and the fourth width is greater than the line width, and the fourth width is greater than the third width. In one embodiment, the third width is equal to the first width, and the fourth width is equal to the second width. The two branch lines may have an impedance that is controlled by using the first width of the first opening parts and the third width of the third opening parts, and the four branch lines may have an impedance that is controlled by using the second width of the second opening parts and the fourth width of the fourth opening parts. In one embodiment, the impedance of the two branch lines is two times higher than an impedance of the main line, and the impedance of the four branch lines is four times higher than the impedance of the main line.

In one embodiment, the PCB further includes a dielectric layer disposed between the strip transmission line and each of the upper and lower ground layers.

According to another aspect, the present invention is directed to a multi-layer PCB assembly comprising a stack of unit PCBs. Each of the unit PCBs comprises: a strip transmission line and an upper ground layer and a lower ground layer respectively disposed over and under the strip transmission line. At least one of strip transmission lines of the unit PCBs comprises a main line and at least one pair of branch lines branching off from the main line. Upper and lower ground layers disposed over and under the at least one strip transmission line comprising the main line and the at least one pair of branch lines have upper and lower opening parts each corresponding in position to the branch lines.

In one embodiment, the branch lines comprise at least one of two branch lines and four branch lines. The width of the upper and lower opening parts corresponding in position to the two branch lines is less than the width of the upper and lower opening parts corresponding in position to the four branch lines and is greater than each of a line width of the main line and a line width of the branch lines.

Each of the unit PCBs may further comprise: a base member having a top surface and a bottom surface on which the upper ground layer and the strip transmission line are respectively disposed; and an adhesive member adhering the lower ground layer to the base member and the strip transmission line. A lower ground layer of an upper unit PCB may act as an upper ground layer of a lower unit PCB disposed under the upper unit PCB.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 3:
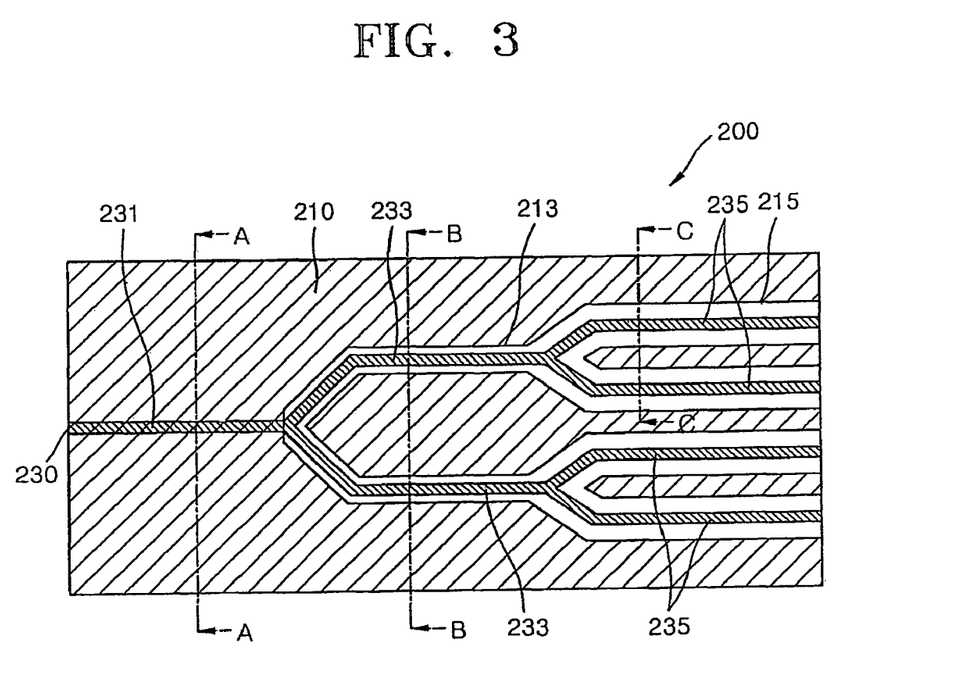
FIG. 3 is a plan view of a PCB having an impedance-matched strip transmission line according to an embodiment of the present invention.
Figure 4A:
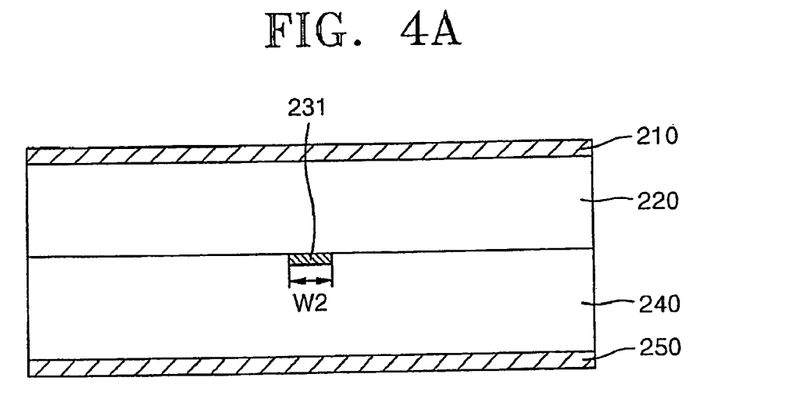
FIG. 4A is a cross-sectional view taken along line A-A of FIG. 3.
Figure 4B:
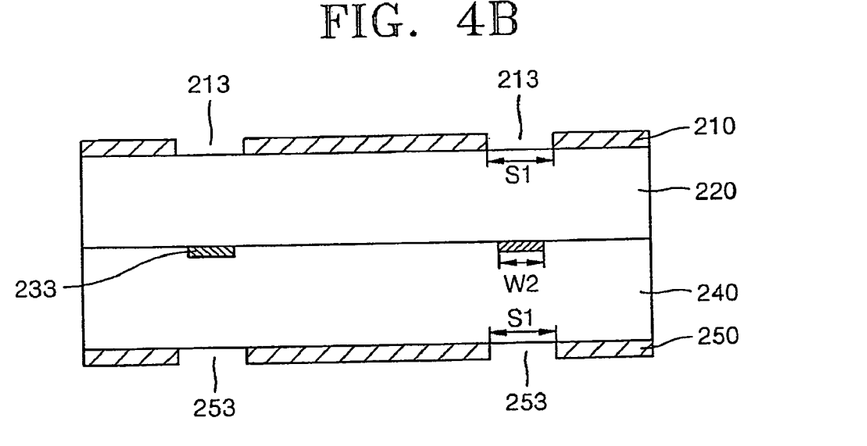
FIG. 4B is a cross-sectional view taken along line B-B of FIG. 3.
Figure 4C:
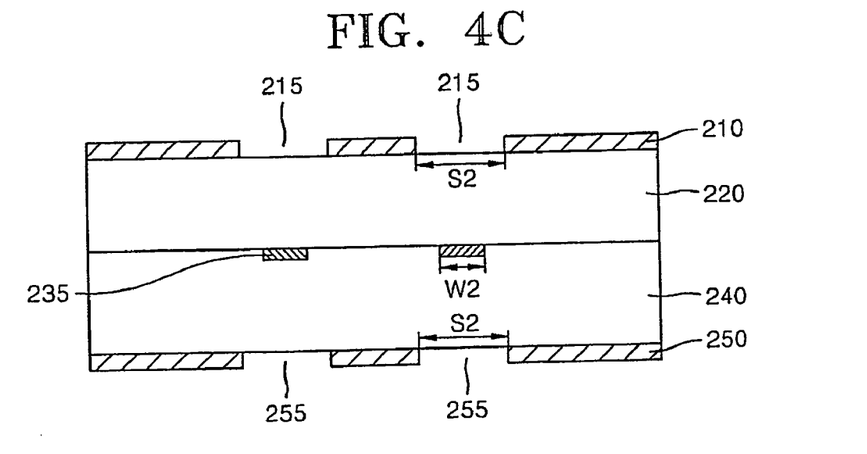
FIG. 4C is a cross-sectional view taken along line C-C of FIG. 3.

FIG. 3 is a plan view of a printed circuit board (PCB) 200 according to an embodiment of the present invention. FIG. 4A is a cross-sectional view taken along line A-A of FIG. 3. FIG. 4B is a cross-sectional view taken along line B-B of FIG. 3. FIG. 4C is a cross-sectional view taken along line C-C of FIG. 3. Referring to FIGS. 3 and 4A through 4C, an upper ground layer 210 is disposed on a first surface of a base member 220 and a strip transmission line 230 is disposed on a second surface of the base member 220. A lower ground layer 250 is attached by an adhesive member 240 to the second surface of the base member 220 and the strip transmission line 230. The base member 220 may include a core substrate. The adhesive member 240 may include a prepreg layer. Each of the upper and lower ground layers 210 and 250 may include a copper layer. The strip transmission line 230 may include a copper line.

The strip transmission line 230 includes a first transmission line portion 231, a second transmission line portion 233, and a third transmission line portion 235. The first transmission line portion 231 includes a main line having a line width W2. The second transmission line portion 233 includes a pair of (two) branch lines branching off from the first transmission line portion 231, and has the line width W2. The third transmission line portion 235 includes two pairs of (four) branch lines branching off from the two branch lines of the second transmission line portion 233, and has the line width W2.

The upper ground layer 210 has first opening parts 213 and second opening parts 215. The first opening parts 213 correspond in position to the two branch lines of the second transmission line portion 233 of the strip transmission line 230. A first width S1 of each of the first opening parts 213 may be greater than the line width W2 of the second transmission line portion 233. The second opening parts 215 correspond in position to the four branch lines of the third transmission line portion 235 of the strip transmission line 230. A second width S2 of each of the second opening parts 215 may be greater than the first width S1 of the first opening parts 213.

The lower ground layer 250 has third opening parts 253 and fourth opening parts 255. The third opening parts 253 correspond in position to the two branch lines of the second transmission line portion 233 of the strip transmission line 230. The third opening parts 253 may have the same width as the first width S1 of the first opening parts 213. The fourth opening parts 255 correspond in position to the four branch lines of the third transmission line portion 235 of the strip transmission line 230. The fourth opening parts 255 may have the same width as the second width S2 of the second opening parts 215. The first opening parts 213 and the third opening parts 253 are symmetric about the second transmission line portion 233 of the strip transmission line 230, and the second opening parts 215 and the fourth opening parts 255 are symmetric about the third transmission line portion 235 of the strip transmission line 230. The second and third transmission lines 233 and 235 of the strip transmission line 230 do not overlap with the upper ground layer 210 and the lower ground layer 250.

When the strip transmission line 230 of the PCB 200 is applied to a divider, the first transmission line portion 231 is a divide-by-1 line that transmits a transmission signal input through the strip transmission line 230 without division, and the second transmission line portion 233 is a divide-by-2 line that divides a transmission signal transmitted through the first transmission line portion 231 into two signals, and transmits the two signals. The third transmission line portion 235 is a divide-by-4 line that divides a transmission signal transmitted through the first transmission line portion 231 into four signals, and transmits the four signals. That is, the third transmission line portion 235 divides the two signals obtained by the second transmission line portion 233 into the four signals.

For example, when the first transmission line portion 231 has an impedance Z11 of 50 Ω, the second transmission line portion 233 has an impedance Z13 of 100 Ω and the third transmission line portion 235 has an impedance Z15 of 200. In order to achieve impedance matching in the strip transmission line 230, the impedances Z11, Z13, and Z15 of the first transmission line portion 231, which is the divide-by-1 line, the second transmission line portion 233, which is the divide-by-2 line, and the third transmission line portion 235, which is the divide-by-4 line, should be matched with one another.

Figure 5:
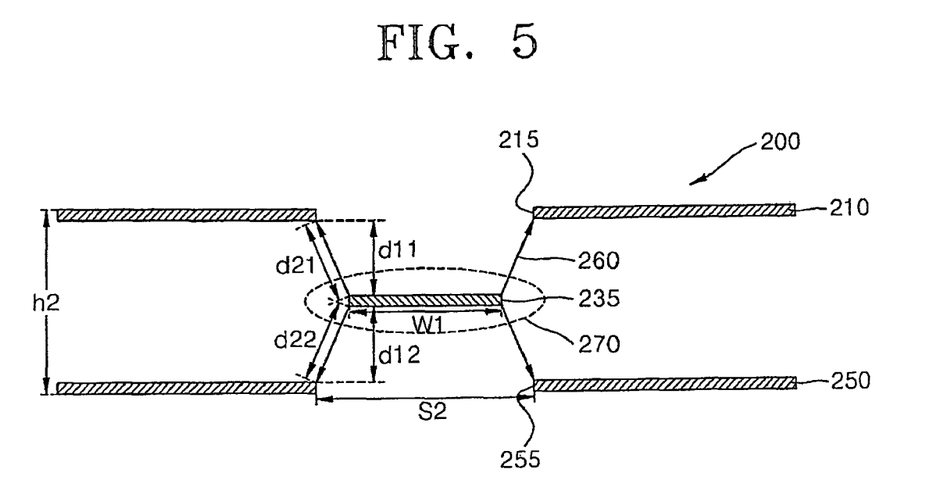
FIG. 5 is a cross-sectional view illustrating a method of controlling an impedance of a strip transmission line of the PCB of FIG. 3 according to an embodiment of the present invention.

FIG. 5 is a cross-sectional view illustrating a method of controlling an impedance of the strip transmission line 230 of the PCB 200 of FIG. 3. Referring to FIG. 5, when a thickness h2 of the PCB 200 is constant, it is known from Equation 1 that the impedance Z15 of the third transmission line portion 235 of the strip transmission line 230 increases in inverse proportion to a capacitance C and increases in proportion to an inductance L. Since the line width W2 of the third transmission line portion 235 of the strip transmission line 230 is constant, a magnetic field 270 generated around the third transmission line portion 235 is constant. Accordingly, since the inductance L is constant, the impedance Z15 of the third transmission line portion 235 is determined by the capacitance C.

The capacitance C is determined by distances d21 and d22 between the third transmission line portion 235 and the upper and lower ground layers 210 and 250. The distance d21 is actually a distance between a side surface of the third transmission line portion 235 and a side surface of the upper ground layer 210 which is exposed by the second opening parts 215. The distance d22 is actually a distance between the side surface of the third transmission line portion 235 and a side surface of the lower ground layer 250 which is exposed by the fourth opening parts 255. Since shortest distances between the third transmission line portion 235 and the upper and lower ground layers 210 and 250 are the distances d21 and d22, an electric field 260 is concentrated on the side surface of the third transmission line portion 235 and the side surface of each of the upper and lower ground layers 210 and 250.

The distance d21 between the side surface of the third transmission line portion 235 of the strip transmission line 230 and the side surface of the upper ground layer 210 which is exposed by the second opening parts 215 is greater than a distance d11 between a top surface of the third transmission line portion 235 and a bottom surface of the upper ground layer 210 (see FIG. 1). Also, the distance d22 between the side surface of the third transmission line portion 235 of the strip transmission line 230 and the side surface of the lower ground layer 250 which is exposed by the fourth opening parts 255 is greater than a distance d12 between a bottom surface of the third transmission line portion 235 and a top surface of the lower ground layer 250 (see FIG. 1). The distances d21 and d22 are determined by the second width S2 of the second and fourth opening parts 215 and 255.

Accordingly, the distances d21 and d22 between the third transmission line portion 235 and the upper and lower ground layers 210 and 250 can be increased by increasing the second width S2 of the second and fourth opening parts 215 and 255 of the first and second ground layers 210 and 250 corresponding in position to the branch lines of the third transmission line portion 235 of the strip transmission line 230. Once the distances d21 and d22 are increased, the capacitance C is reduced, thereby increasing the impedance Z15 of the third transmission line portion 235 of the strip transmission line 230. The thickness of each of the adhesive member 240 and the base member 220 may be adjusted so that the distances d21 and d22 are the same.

When each of the base member 220 and the adhesive member 240 has a constant dielectric constant, the line width W2 of the strip transmission line 230 is constant, and the thickness h2 of the PCB 200 is constant as described above, the impedance Z15 of the third transmission line portion 235 is determined by the distances d21 and d22. Hence, since the distances d21 and d22 are determined by the second width S2 of the second and fourth opening parts 215 and 255, the impedance Z15 of the third transmission line portion 235 can be controlled by controlling the second width S2 of the second and fourth opening parts 215 and 255.

Likewise, the impedance Z13 of the second transmission line portion 233 of the strip transmission line 230 is determined by distances between the second transmission line portion 233 of the strip transmission line 230 and the upper and lower ground layers 210 and 250. Hence, the impedance Z13 of the second transmission line portion 233 can be controlled by controlling the first width S1 of the first and third opening parts 213 and 253. Therefore, the impedances Z11, Z13, and Z15 of the first through third transmission line portions 231, 233, and 235 of the strip transmission line 230 can be matched with one anther by controlling the first width S1 of the first and third opening parts 213 and 253 and the second width S2 of the second and fourth opening parts 215 and 255 of the upper and lower ground layers 210 and 250.

Figure 6A:
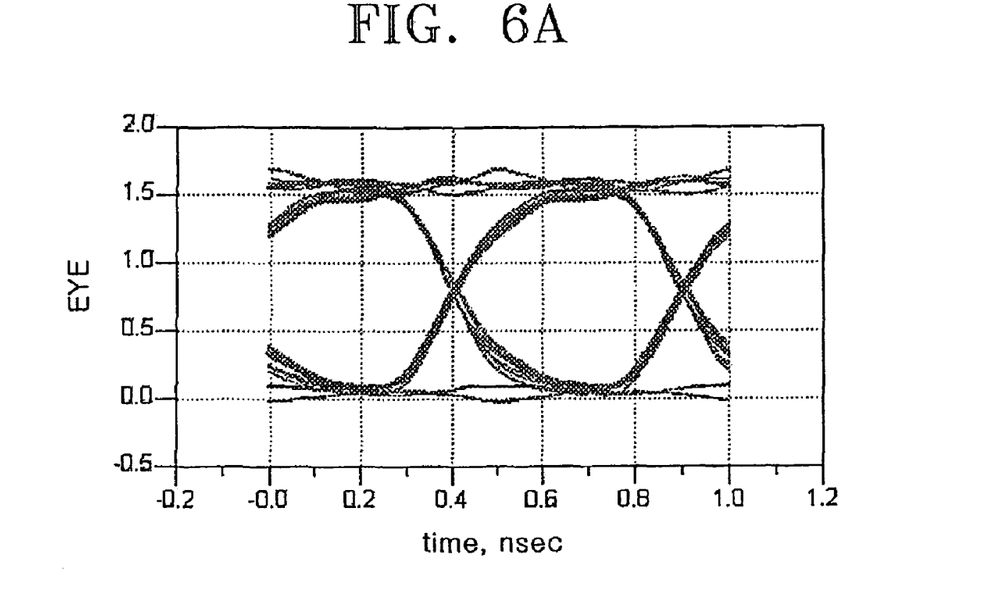
FIGS. 6A and 6B are graphs illustrating simulation results of impedance characteristics of the PCB of FIG. 3 according to an embodiment of the present invention.
Figure 6B:
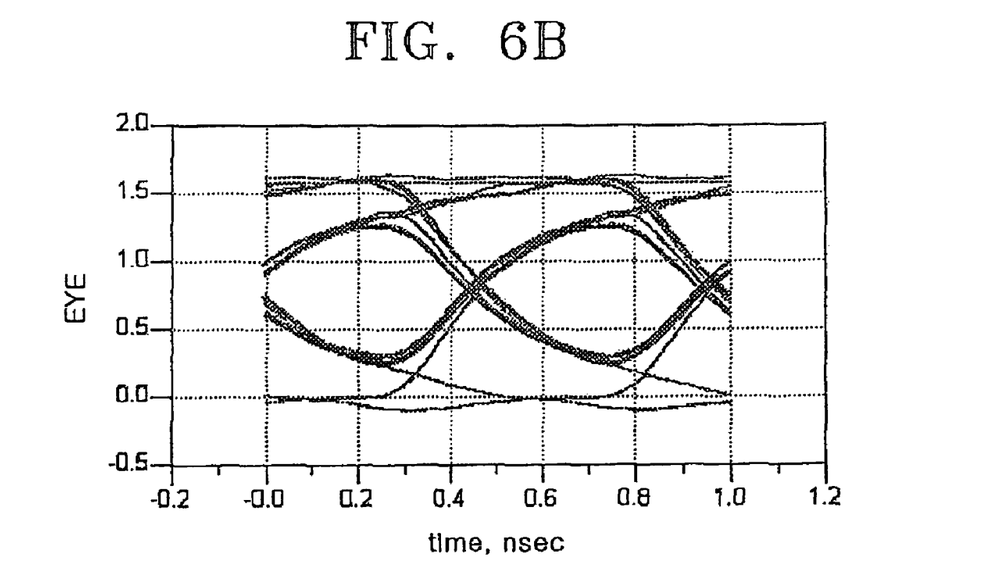

FIGS. 6A and 6B are graphs illustrating simulation results of impedance characteristics of the PCB 200 of FIG. 3 according to an embodiment of the present invention. FIG. 6A illustrates simulation results of impedance characteristics in the second transmission line portion 233 including the two branch lines and, and FIG. 6B illustration simulation results of impedance characteristics in the third transmission line portion 235 including the four branch lines. Referring to FIGS. 6A and 6B, since the impedances Z11, Z13, and Z15 of the first through third transmission line portions 231, 233, and 235 are matched with one another by controlling the impedances Z13 and Z15 of the second transmission line portion 233 and the third transmission line portion 235 of the strip transmission line 230, a transmission signal is not reflected but is correctly transmitted, thereby ensuring good transmission characteristics.

Figure 7:
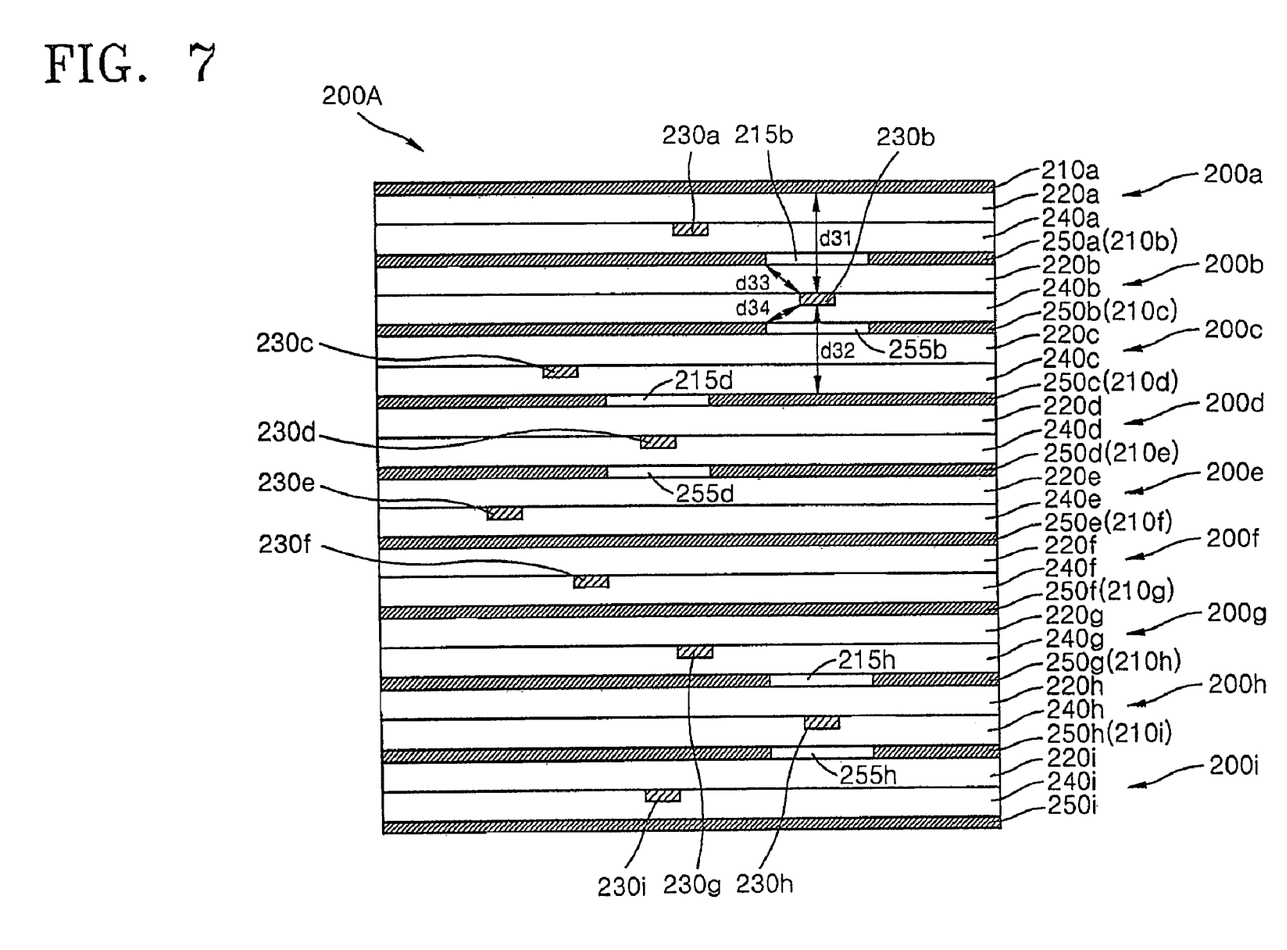
FIG. 7 is a cross-sectional view of a multi-layer PCB assembly according to an embodiment of the present invention.

FIG. 7 is a cross-sectional view of a multi-layer PCB assembly 200A according to an embodiment of the present invention. Referring to FIG. 7, the multi-layer PCB assembly 200A has a stack of unit PCBs 200a through 200i. A first upper ground layer 210a is disposed on a first surface of a first base member 220a of a first unit PCB 200a, and a first strip transmission line 230a is disposed on a second surface of the first base member 220a. A second upper ground layer 210b is disposed on a first surface of a second base member 220b of a second unit PCB 200, and a second strip transmission line 230b is disposed on a second surface of the second base member 220b. The second upper ground layer 210b of the second unit PCB 200b is attached to the first strip transmission line 230a and the first base member 220a of the first unit PCB 200a by a first adhesive member 240a. The second upper ground layer 210b acts as a first lower ground layer 250a of the first unit PCB 200a as well.

A third unit PCB 200c including a third upper ground layer 210c and a third strip transmission line 230c respectively disposed on first and second surfaces of a third base member 220c is attached to the second strip transmission line 230b and the second base member 220b of the second unit PCB 200b by a second adhesive member 240b, and the third upper ground layer 210c acts as a second lower ground layer 250b of the second unit PCB 200b as well.

Likewise, fourth through ninth unit PCBs 200d through 200i including fourth through ninth upper ground layers 210d through 210i and fourth through ninth strip transmission lines 230d through 230i respectively disposed on first and second surfaces of fourth through ninth base members 220d through 220i are attached to the third through eighth strip transmission lines 230c through 230h and the third through eighth base members 220c through 220h of the third through eighth unit PCBs 200c through 200h by third through eighth adhesive members 240c through 240h. The fourth through ninth upper ground layers 210d through 210i act as third through eighth lower ground layers 250c through 250h of the third through eighth unit PCBs 200c through 200h as well.

A ninth lower ground layer 250i of the ninth unit PCB 200i is attached to the ninth strip transmission line 230i and the ninth base member 220i by a ninth adhesive member 240i. Each of the first through ninth base members 220a through 220i may include a core substrate, and each of the first through ninth adhesive members 240a through 240i may include a prepreg layer.

Some of the first through ninth strip transmission lines 230a through 230i of the first through ninth unit PCBs 200a through 200i, for example, the first, third, fifth, sixth, seventh, and ninth strip transmission lines 230a, 230c, 230e, 230f, 230g, and 230i, may be transmission lines including no branch lines. The remaining strip transmission lines, for example, the second, fourth, and eighth transmission lines 230b, 230d, and 230h, may be transmission lines including branch lines. The second, fourth, and eighth strip transmission lines 230b, 230d, and 230h may be transmission lines including two branch lines or/and four branch lines as shown in FIG. 3. FIG. 7 illustrates that the second, fourth, and eighth strip transmission lines 230b, 230d, and 230h include two branch lines or four branch lines as shown in FIG. 3.

The second, fourth, and eighth strip transmission lines 230b, 230d, and 230h may have the same structure as the second or third transmission line portion 233 or 235 of FIGS. 3 and 4A through 4C. The second upper and lower ground layers 210b and 250b disposed over and under the second strip transmission line 230b may have first upper and lower opening parts 215b and 255b corresponding in position to the branch lines of the second strip transmission line 230b. The first upper and lower opening parts 215b and 255b may have the same width. The fourth upper and lower ground layers 210d and 250d disposed over and under the fourth strip transmission line 230d may have second upper and lower opening parts 215d and 255d corresponding in position to the branch lines of the fourth strip transmission line 230d. The second upper and lower opening parts 215d and 255d may have the same width. The eighth upper and lower ground layers 210h and 250h disposed over and under the eighth strip transmission line 230h may have third upper and lower opening parts 215h and 255h corresponding in position to the branch lines of the eighth strip transmission line 230h. The third upper and lower opening parts 215h and 255h may have the same width. When the second, fourth, and eighth strip transmission lines 230b, 230d, and 230h include the same number of branch lines, the first, second, and third upper and lower opening parts 215b, 255b, 215d, 255d, 215h, and 255h may have the same width.

For example, in the case of the second unit PCB 200b, since the first upper and lower opening parts 215b and 255b are formed in the second upper and lower ground layers 210b and 250b, a distance between a top surface of the second strip transmission line 230b and a ground layer is actually a distance d31 between the second strip transmission line 230b and the first upper ground layer 210a, and a distance between a bottom surface of the second strip transmission line 230b and a ground layer is actually a distance d32 between the second strip transmission line 230b and the third lower ground layer 250c. d33 denotes a distance between a side surface of the second strip transmission line 230b and a side surface of the second upper ground layer 210b, and d34 denotes a distance between the side surface of the second strip transmission line 230b and a side surface of the second lower ground layer 250b. If each of the distances d33 and d34 is less than each of the distances d31 and d32, an electric field E is concentrated between the side surface of the second strip transmission line 230b and the side surface of each of the second upper and lower ground layers 210b and 250b. Accordingly, an impedance of the second strip transmission line 230b can be controlled by controlling the width of the first upper and lower opening parts 215b and 255b.

Likewise, in the cases of the fourth and eighth strip transmission lines 230d and 230h including the branch lines, impedances of the fourth and eighth strip transmission lines 230d and 230h can be controlled by controlling the width of the second and third upper and lower opening parts 215d, 255d, 215h, and 255h. Therefore, impedance matching can be achieved in the strip transmission lines 230a through 230i of the first through ninth unit PCBs 200a through 200i.

As described above, since portions of a ground layer corresponding in position to branch lines are removed from a strip transmission line, the PCB according to the present invention can achieve impedance matching by controlling a distance between the ground layer and the strip transmission line. Accordingly, impedance matching can be readily controlled without reducing the line width of the strip transmission line or increasing the thickness of the PCB.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A printed circuit board (PCB) comprising:
   a strip transmission line including a main line and at least one pair of branch lines branching off from the main line;
   an upper ground layer disposed over the strip transmission line and having upper opening parts corresponding in position to the branch lines; and
   a lower ground layer disposed under the strip transmission line and having lower opening parts corresponding in position to the branch lines,
   wherein the upper and lower opening parts are symmetric about the branch lines of the strip transmission line.

2. The PCB of claim 1, further comprising a dielectric layer disposed between the strip transmission line and each of the upper and lower ground layers.

3. The PCB of claim 1, wherein the main line and the branch lines have the same line width.

4. The PCB of claim 3, wherein the strip transmission line includes two branch lines.

5. The PCB of claim 4, wherein the upper opening parts and the lower opening parts have the same width.

6. The PCB of claim 5, wherein the width of the upper and lower opening parts is greater than the line width of the strip transmission line.

7. The PCB of claim 6, wherein the two branch lines have an impedance that is controlled by the width of the upper and lower opening parts.

8. The PCB of claim 7, wherein the two branch lines have an impedance that is twice as high as an impedance of the main line.

9. The PCB of claim 3, wherein the strip transmission line includes at least one pair of (two) branch lines and at least two pairs of (four) branch lines.

10. The PCB of claim 9, wherein the upper opening parts of the upper ground layer comprise:
    first opening parts having a first width and corresponding in position to the two branch lines; and
    second opening parts having a second width and corresponding in position to the four branch lines.

11. The PCB of claim 10, wherein each of the first width and the second width is greater than the line width, and the second width is greater than the first width.

12. The PCB of claim 11, wherein the lower opening parts of the lower ground layer comprise:
    third opening parts having a third width and corresponding in position to the two branch lines; and
    fourth opening parts having a fourth width and corresponding in position to the four branch lines.

13. The PCB of claim 12, wherein each of the third width and the fourth width is greater than the line width, and the fourth width is greater than the third width.

14. The PCB of claim 13, wherein the third width is equal to the first width, and the fourth width is equal to the second width.

15. The PCB of claim 14, wherein the two branch lines have an impedance that is controlled by using the first width of the first opening parts and the third width of the third opening parts, and the four branch lines have an impedance that is controlled by using the second width of the second opening parts and the fourth width of the fourth opening parts.

16. The PCB of claim 15, wherein the impedance of the two branch lines is two times higher than an impedance of the main line, and the impedance of the four branch lines is four times higher than the impedance of the main line.

17. A multi-layer PCB assembly comprising a stack of unit PCBs,
    wherein each of the unit PCBs comprises:
    a strip transmission line; and
    an upper ground layer and a lower ground layer respectively disposed over and under the strip transmission line,
    wherein at least one of strip transmission lines of the unit PCBs comprises a main line and at least one pair of branch lines branching off from the main line,
    wherein upper and lower ground layers disposed over and under the at least one strip transmission line comprising the main line and the at least one pair of branch lines have upper and lower opening parts each corresponding in position to the branch lines.

18. The multi-layer PCB assembly of claim 17, wherein the branch lines comprise at least one of two branch lines and four branch lines,
    wherein the width of the upper and lower opening parts corresponding in position to the two branch lines is less than the width of the upper and lower opening parts corresponding in position to the four branch lines, and is greater than each of a line width of the main line and a line width of the branch lines.

19. The multi-layer PCB assembly of claim 18, wherein each of the unit PCBs further comprises:
    a base member having a top surface and a bottom surface on which the upper ground layer and the strip transmission line are respectively disposed; and
    an adhesive member adhering the lower ground layer to the base member and the strip transmission line.

20. The multi-layer PCB assembly of claim 19, wherein a lower ground layer of an upper unit PCB acts as an upper ground layer of a lower unit PCB that is disposed under the upper unit PCB.

* * * * *